(12) United States Patent
Bennett et al.

(10) Patent No.: US 9,966,673 B2
(45) Date of Patent: May 8, 2018

(54) WINDOW ASSEMBLY WITH ELECTRICALLY CONDUCTIVE COMPRESSIBLE MEMBER

(71) Applicants: AGC Automotive Americas R&D, Inc., Ypsilanti, MI (US); AGC Flat Glass North America, Inc., Alpharetta, GA (US)

(72) Inventors: Daniel D. Bennett, Tecumseh, MI (US); William C. Schuch, Adrian, MI (US)

(73) Assignees: AGC AUTOMOTIVE AMERICAS R&D, INC., Ypsilanti, MI (US); AGC FLAT GLASS NORTH AMERICA, INC., Alpharetta, GA (US)

( * ) Notice: Subject to any disclaimer, the term of this patent is extended or adjusted under 35 U.S.C. 154(b) by 0 days. days.

(21) Appl. No.: 14/912,244

(22) PCT Filed: Aug. 15, 2014

(86) PCT No.: PCT/US2014/051250
§ 371 (c)(1),
(2) Date: Feb. 16, 2016

(87) PCT Pub. No.: WO2015/023936
PCT Pub. Date: Feb. 19, 2015

(65) Prior Publication Data
US 2016/0204524 A1    Jul. 14, 2016

Related U.S. Application Data

(60) Provisional application No. 61/866,911, filed on Aug. 16, 2013.

(51) Int. Cl.
*H01R 24/00* (2011.01)
*H01R 4/28* (2006.01)
(Continued)

(52) U.S. Cl.
CPC ............ *H01R 4/28* (2013.01); *B23K 1/0008* (2013.01); *B23K 1/19* (2013.01); *H01R 4/02* (2013.01);
(Continued)

(58) Field of Classification Search
CPC . H01R 12/585; H01R 12/707; H01R 43/0256
(Continued)

(56) References Cited

U.S. PATENT DOCUMENTS 6,878,246 B2 *   4/2005   Latvaitis .................. C25C 3/12
                                                                                204/280
7,180,031 B1     2/2007   Loibl et al.
(Continued)

FOREIGN PATENT DOCUMENTS

GB     2 192 023 A        12/1987
WO     WO 2009/015975 A1   2/2009
WO     WO 2015/023921 A1   2/2015

OTHER PUBLICATIONS

International Search Report for Application No. PCT/US2014/051250 dated Nov. 27, 2014, 3 pages.
(Continued)

*Primary Examiner* — Phuong Dinh
(74) *Attorney, Agent, or Firm* — Howard & Howard Attorneys PLLC

(57) ABSTRACT

A window assembly (10) includes a transparent pane (18), an electrical conductor (20) contacting the transparent pane (18), an electrical connection element (22) for energizing the electrical conductor (20), an encapsulation (26) disposed over the electrical connection element (22) and the electrical conductor (20), and an electrically conductive compressible member (28) disposed between the electrical connection element (22) and the electrical conductor (20) for providing (Continued)

an electrical connection between the electrical connection element (22) and the electrical conductor (20).

16 Claims, 3 Drawing Sheets

(51) Int. Cl.
| | |
|---|---|
| *B23K 1/00* | (2006.01) |
| *B23K 1/19* | (2006.01) |
| *H05B 3/86* | (2006.01) |
| *H05K 1/02* | (2006.01) |
| *H05B 1/02* | (2006.01) |
| *H05K 3/40* | (2006.01) |
| *H01R 4/02* | (2006.01) |
| *H01R 13/24* | (2006.01) |
| *H05B 3/84* | (2006.01) |
| *H05K 1/03* | (2006.01) |
| *H05K 3/34* | (2006.01) |

(52) U.S. Cl.
CPC ....... *H01R 13/2414* (2013.01); *H05B 1/0236* (2013.01); *H05B 3/84* (2013.01); *H05B 3/86* (2013.01); *H05K 1/0212* (2013.01); *H05K 3/40* (2013.01); *H01R 2201/26* (2013.01); *H05B 2203/016* (2013.01); *H05K 1/0306* (2013.01); *H05K 3/3421* (2013.01); *H05K 2201/10356* (2013.01); *H05K 2201/10977* (2013.01)

(58) Field of Classification Search
USPC ................................................. 439/876, 86
See application file for complete search history.

(56) References Cited

U.S. PATENT DOCUMENTS

| | | | |
|---|---|---|---|
| 7,270,548 | B2 | 9/2007 | Jenrich et al. |
| 7,510,401 | B2* | 3/2009 | Humpston ........ H01L 23/49811 |
| | | | 439/66 |
| 2004/0095284 | A1 | 5/2004 | Mueller et al. |
| 2007/0029301 | A1 | 2/2007 | Tokiwa et al. |
| 2012/0067641 | A1 | 3/2012 | Tokiwa et al. |
| 2012/0091113 | A1 | 4/2012 | Bennett et al. |
| 2012/0117880 | A1* | 5/2012 | Lahnala ................. B60J 1/1853 |
| | | | 49/70 |
| 2013/0052859 | A1 | 2/2013 | Ziegler et al. |
| 2013/0175255 | A1 | 7/2013 | Kim et al. |

OTHER PUBLICATIONS

International Search Report for Application No. PCT/US2014/051216 dated Nov. 27, 2014, 3 pages.

* cited by examiner

WINDOW ASSEMBLY WITH ELECTRICALLY CONDUCTIVE COMPRESSIBLE MEMBER

CROSS-REFERENCE TO RELATED APPLICATION(S)

This application is the National Stage of International Patent Application No. PCT/US2014/051250, filed on Aug. 15, 2014, which claims priority to and all the advantages of U.S. Provisional Patent Application No. 61/866,911, filed on Aug. 16, 2013, the entire content of which is incorporated herein by reference.

BACKGROUND OF THE INVENTION

1. Field of the Invention

The present invention relates generally to window assemblies and, more specifically to, a window assembly with an electrically conductive compressible member.

2. Description of the Related Art

Window assemblies for vehicles are often functionalized to include a transparent pane having an electrical conductor bonded to a connection element through a solder joint. The electrical conductor typically includes a printed silver circuit. The printed silver circuit is disposed on a surface of the transparent pane contained within the window assembly. Typically, power is transferred through a wire harness to the printed silver circuit. The wire harness has an electrical connection element which is electrically coupled to the printed silver circuit through the solder joint.

The window assembly is often further functionalized to include additional components, such as frames, rails, or guides. When the window assembly includes additional components, an encapsulation may be utilized to attach these additional components to the window assembly. Typically, the encapsulation is made of a polymeric material disposed on the solder joint when the encapsulation is utilized to attach these additional components.

However, the window assembly is prone to a variety of unacceptable defects when the encapsulation is disposed on the solder joint. For example, when the encapsulation is disposed on the solder joint, the differences between the coefficients of thermal expansion of the solder joint, the transparent pane, and the encapsulation impart mechanical stress on the transparent pane, such that when the transparent pane is a glass pane, the glass pane is prone to cracking. The mechanical stress may also delaminate the printed silver circuit from the transparent pane or separate the solder joint from the printed silver circuit. Moreover, the mechanical stress may also crack the solder joint.

In another example, the encapsulation may permit water to contact the printed silver circuit near the solder joint. Water routinely penetrates through the encapsulation to contact the printed silver circuit near the solder joint. Water that has contacted the printed silver circuit near the solder joint is slow to evaporate because the water is disposed between the encapsulation and the printed silver circuit. As such, the water may corrode the printed silver circuit, thereby rendering the printed silver circuit inoperable. Accordingly, there remains an opportunity to develop an improved window assembly.

Accordingly, it is desirable to develop a window assembly that does not impart a mechanical stress onto the transparent pane that may cause the transparent pane to crack. Additionally, it would be desirable to develop a window assembly that prevents the intrusion of water to the electrical conductor. It would further be desirable to provide a window assembly that is less prone to failure. Therefore, there is a need in the art for a window assembly that meets at least one of these desires.

SUMMARY OF THE INVENTION

Accordingly, the present invention provides a window assembly including a transparent pane and an electrical conductor contacting the transparent pane. The window assembly also includes an electrical connection element for energizing the electrical conductor. The window assembly includes an encapsulation over the electrical connection element and the electrical conductor. The window assembly further includes an electrically conductive compressible member disposed between the electrical connection element and the electrical conductor for providing an electrical connection between the electrical connection element and the electrical conductor.

One advantage of the present invention is that a new window assembly is provided with an electrically conductive compressible member between the electrical connection element and the electrical conductor. Another advantage of the present invention is that the window assembly includes the electrically conductive compressible member and eliminates the need for solder or a solder joint. Yet another advantage of the present invention is that the window assembly includes the electrically conductive compressible member that electrically connects the electrical conductor and the terminal connector. Still another advantage of the present invention is that the window assembly includes the electrically conductive compressible member that is compressible and largely absorbs stress generated by differences in the coefficients of thermal expansion, which is not imparted onto the electrical conductor. A further advantage of the present invention is that the window assembly replaces the solder (e.g. the solder joint) with the electrically conductive compressible member and produces a window assembly that is more environmentally friendly as it is inherently lead-free due to the elimination of solder and less prone to failure.

Other features and advantages of the present invention will be readily appreciated, as the same becomes better understood, after reading the subsequent description taken in conjunction with the accompanying drawings.

DESCRIPTION OF THE PREFERRED EMBODIMENT(S)

Figure 1:
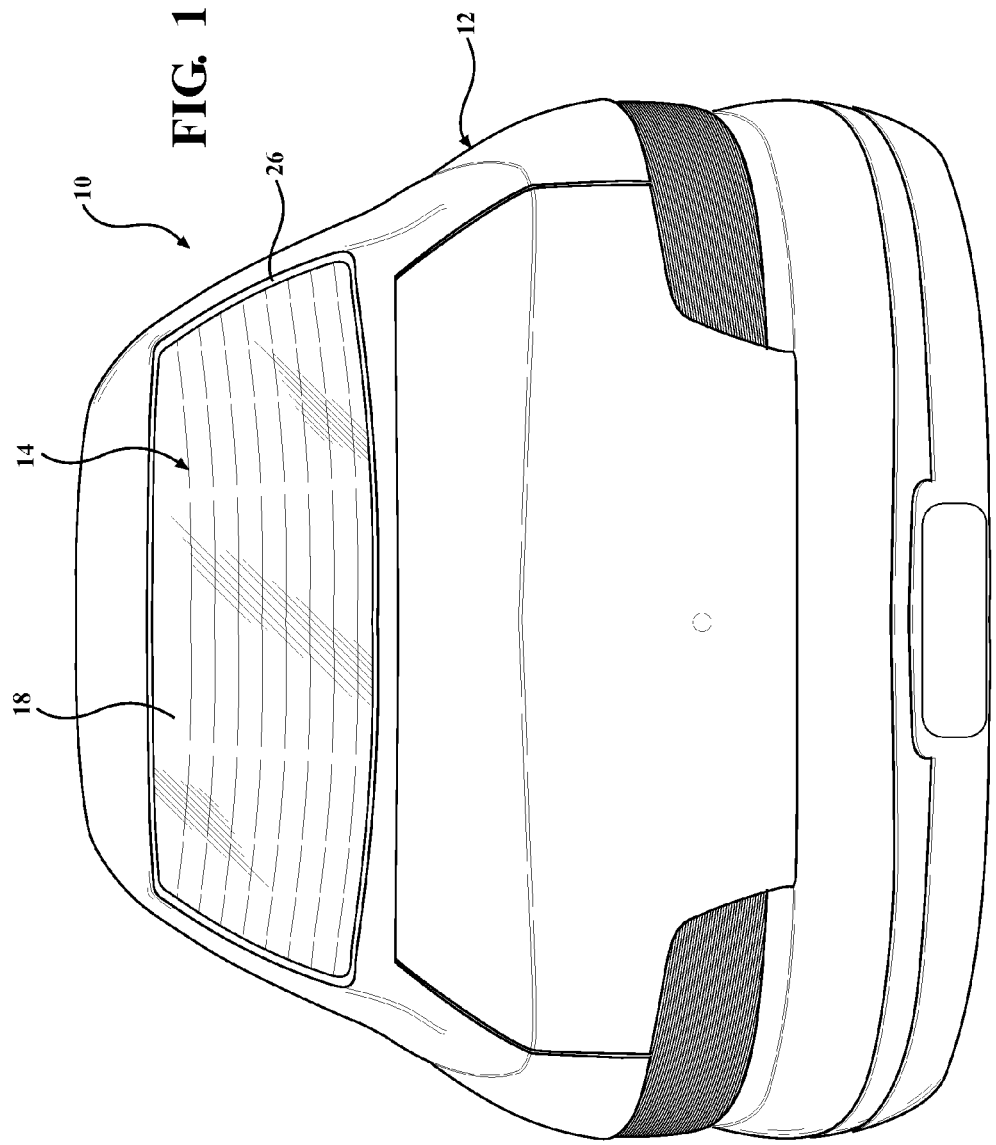
FIG. 1 is an elevational view of one embodiment of a window assembly, according to the present invention, illustrated in operational relationship with a vehicle.
Figure 2:
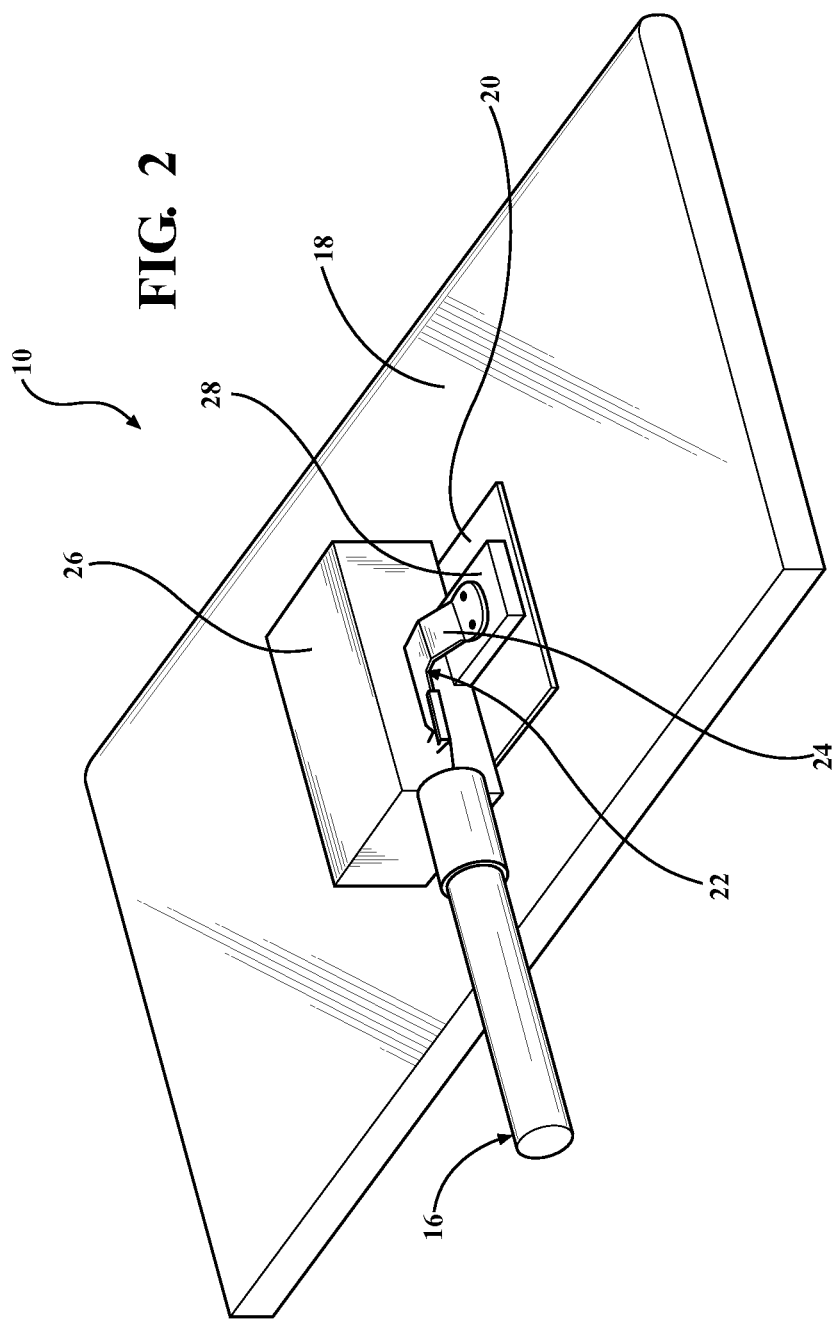
FIG. 2 is a partial cross sectional perspective view of the window assembly of FIG. 1 having a portion of an encapsulation cut away.
Figure 3:
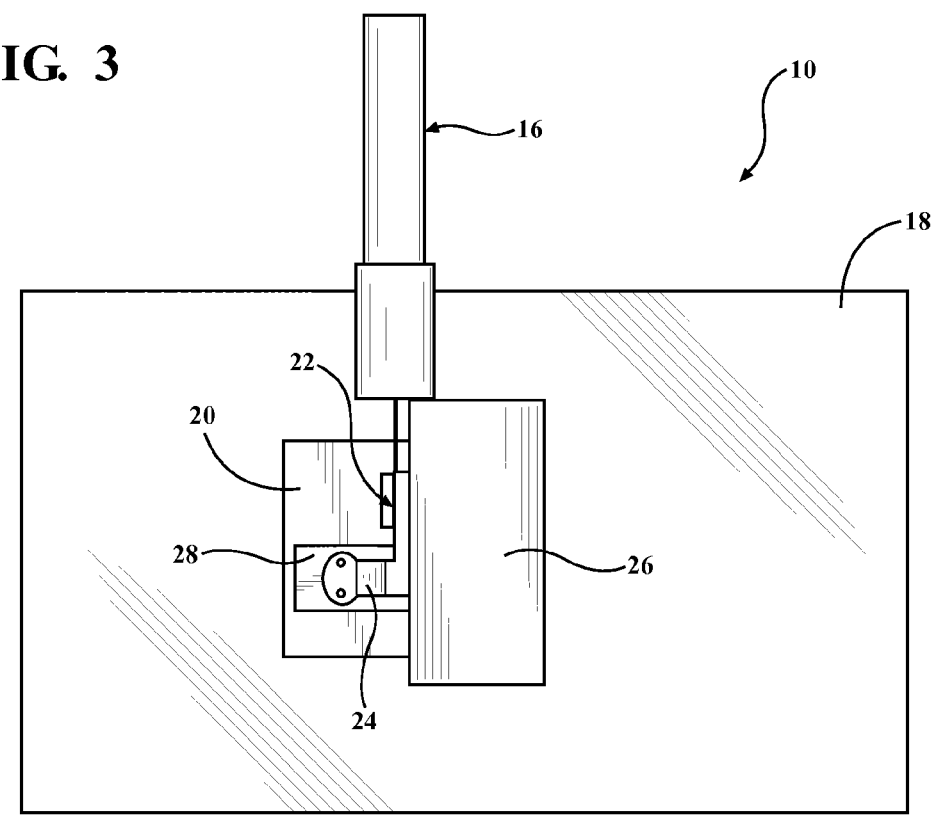
FIG. 3 is a planar top view of the window assembly of FIG. 2.
Figure 4:
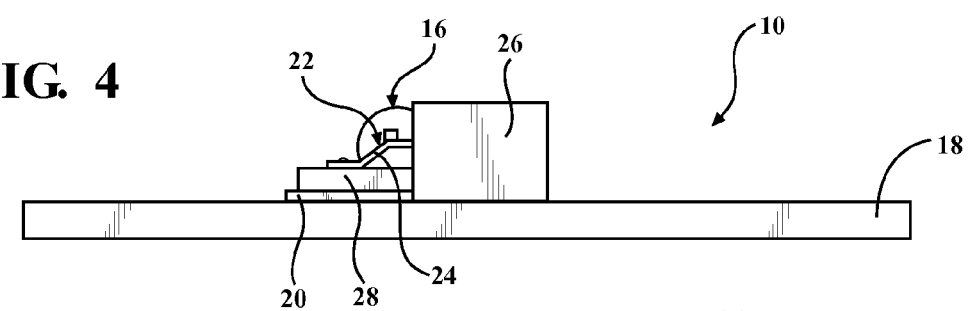
FIG. 4 is a front elevational view of the window assembly of FIG. 2.
Figure 5:
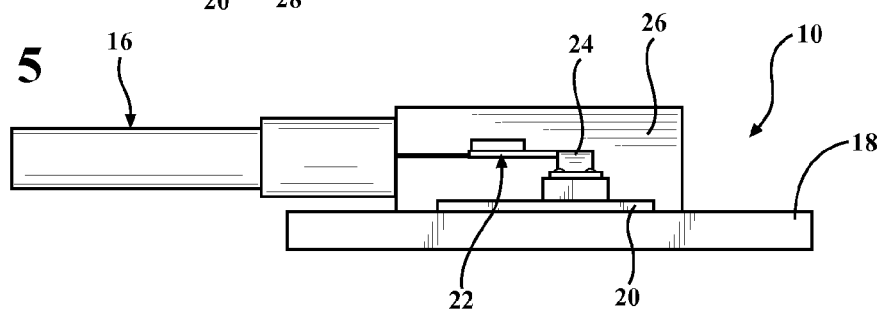
FIG. 5 is a side elevational view of the window assembly of FIG. 2.

Referring to the Figures, wherein like numerals indicate like parts throughout the several views, one embodiment of a window assembly 10, according to the present invention, is shown in FIGS. 1 and 2. The window assembly 10 is a typically for a vehicle, generally indicated at 12, such as an automotive vehicle. As illustrated in FIG. 1, the window assembly 10 may be a rear window assembly having a defrost system, generally indicated at 14. It should be appreciated that the window assembly 10 may be used for other types of vehicles providing a connection between a wiring harness, generally indicated at 16 (FIG. 2), and the defrost system 14 or other components such as an antenna (not shown).

Referring to FIGS. 1 and 2, one embodiment of the window assembly 10, according to the present invention, includes a transparent pane 18. In one embodiment, the transparent pane 18 is made of glass. In another embodiment, the transparent pane 18 is made of a polymethyl methacrylate, polycarbonate, polyvinyl butyral, and the like. The window assembly 10 also includes an electrical conductor 20. In one embodiment, the electrical conductor 20 is made of silver. In other embodiments, the electrical conductor 20 may be made of other conductive metals and/or other conductive or nonconductive materials in addition to, or instead of, silver. The electrical conductor 20 may be a film, a coating, and/or in any other form so long as the electrical conductor 20 is conductive and serves any function known in the art for such electrical conductors. The electrical conductor 20 may be porous and/or nonporous. In various embodiments, the electrical conductor 20 is a porous silver film. In other embodiments, the electrical conductor 20 may be printed, for example, a printed silver film or printed silver circuit. It should be appreciated that, although the electrical conductor 20 is shown to have a rectangular shape, the electrical conductor 20 may have any suitable shape.

In one embodiment, the electrical conductor 20 is disposed on the transparent pane 18 near a peripheral edge of the transparent pane 18. The electrical conductor 20 is often a component of a circuit, such as the defrost system 14, an antenna, a defogger, or the like. It should be appreciated that the electrical conductor 20 may be integral with the circuit or an extension of the circuit. The electrical conductor 20 may include one or more bus bars (not shown). It should be appreciated that the wire harness 16 transfers power from a power supply (not shown) to the electrical conductor 20.

The window assembly 10 also includes an electrical connection element, generally indicated at 22, that connects the wiring harness 16 and the electrical conductor 20 for electrically coupling and operatively connecting the electrical conductor 20 and the power supply. The connection element 22 is in electrical communication with the electrical conductor 20 for energizing the electrical conductor 20. In one embodiment, the connection element 22 may be of copper, a copper alloy, silver, a silver alloy, or combinations thereof. In other embodiments, the connection element 22 may also be of other metals in addition to or absent the metals described above, including, but not limited to, iron, molybdenum, tungsten, nickel, hafnium, tantalum, titanium, chromium, iridium, niobium, vanadium, platinum, tin, or combinations thereof. In one embodiment, the connection element 22 is copper. Typically, the connection element 22 includes a terminal connector 24 that is disposed at a distal end of the wiring harness 16. It should be appreciated that the connection element 22 may be of other conductive metals and/or other conductive or nonconductive material.

As illustrated in FIGS. 1 and 2, the window assembly 10 may include a layer or encapsulation 26 that encapsulates the peripheral edge of the window assembly 10. In one embodiment, the encapsulation 26 is made of a polymer or polymeric material. Non-limiting examples of the polymer include thermoplastic material(s) or thermoset material(s). Other non-limiting examples of the polymer include thermoplastic elastomers (TPE), thermoplastic vulcanizates (TPV), and thermoplastic polyolefins (TPO). Specific non-limiting examples include thermoplastic styrene (TPS), polyurethane, polyvinyl chloride (PVC), and ester based thermoplastic elastomers (E-TPE). It should be appreciated that, in one embodiment, the encapsulation 26 is formed from a reaction injection molding (RIM) process. It should also be appreciated that the encapsulation 26 may be made of non-polymeric materials.

The window assembly 10 may include one or more functional components (not shown) for aligning, positioning, or guiding the window assembly 10 on the vehicle 12. In one example, the functional component may be a rail for allowing the window assembly 10 to slide on a complementary rail attached to the vehicle 12. In another example, the functional component may be a frame for mounting the window assembly 10 to the vehicle 12. The encapsulation 26 attaches the functional components to the window assembly 10. To attach the functional component to the window assembly 10, the encapsulation 26 may encapsulate a portion of the functional component, thereby attaching the functional component to the window assembly 10.

In one embodiment, as illustrated in FIGS. 2 through 5, the window assembly 10 includes an electrically conductive compressible member 28 disposed between the electrical conductor 20 and the terminal connector 24. The compressible member 28 electrically couples the electrical conductor 20 and the terminal connector 24. In addition, the compressible member 28 is elastically deformable, and as such, stress generated by differences in the coefficients of thermal expansion of the encapsulation 26 and the electrical conductor 20 is largely absorbed by the compressible material 28 and not imparted onto the electrical conductor 20.

In one embodiment, the compressible member 28 is made of a compressible material. In one embodiment, the compressible material is a foam. The foam may be an open celled foam or a closed cell foam. More typically, the foam is a polymer, which is foamed or expanded. In certain embodiments, the polymer is a polyurethane, such that the compressible material is a polyurethane foam, e.g. closed cell polyurethane foam. In other embodiments, the polymer is rubber and formed from ethylene propylene diene monomer (EPDM), such that the compressible material is foamed EPDM. In other embodiments, the foam is polystyrene. In yet other embodiments, the polymer is a conductive polymer. Conductive polymers can also be referred to in the art as intrinsically conductive polymers (ICPs), which are polymers that can conduct electrical current or electricity. As such, when the polymer is conductive, the compressible material has conductive properties. It should be appreciated that the compressible member 28 may also be made of an incompressible material that is physically arranged to be compressed between the terminal connector 24 and the electrical conductor 20, for example, a steel formed into a spring shape.

The compressible member 28 may include a conductive filler in the compressible material to establish or increase the conductive properties of the compressible material. The conductive filler can be selected from various conductive fillers understood in the art, such as metal or carbon filler, which can be in various forms such as powder or fibers. In certain embodiments, the conductive filler comprises metal, e.g. a metal powder.

In certain embodiments the compressible member 28 includes a foil layer that is conductive and flexible disposed about the compressible material. The foil layer has a thickness that is less than the thickness of the compressible material. In other words, the foil layer is thin. The foil layer surrounds the compressible material. More specifically, the foil layer surrounds the outer periphery of the compressible material. When the foil layer is used, the foil layer may provide the conductive properties of the compressible material. As such, the foil layer may establish the conductivity of the compressible material. In other words, in certain embodiments, if the foil layer was not present, the compressible material would not have conductive properties. Typically, the foil layer is made of metal, more typically, the foil layer is made of aluminum, copper, brass, nickel, tin, carbon-based compounds, or combinations thereof. In certain embodiments, the foil layer is made of a fabric-reinforced metal, such as fabric-reinforced aluminum. It should be appreciated that the foil layer can be formed of any suitable material(s) for electrically connecting the terminal connector 24 to the electrical conductor 20. It should also be appreciated that the compressible member 28 made of a compressible material, e.g. polyurethane foam, including the foil layer, can also include the conductive filler and/or be formed from the conductive polymer. It should further be appreciated that the compressible member 28 may also be a metallic sponge or metallic foam, for example, spun metal such as steel wool.

In other embodiments, the compressible member 28 is a spring element. Typically, the compressible member 28 is the spring element when the electrical conductor 20 is a component in a circuit intended for low current/low voltage applications such as an antenna.

The encapsulation 26 is disposed on the terminal connector 24 and the compressible member 28. Disposing the encapsulation 26 on the terminal connector 24 and the compressible member 28 ensures that the terminal connector 24 and the electrical conductor 20 are electrically coupled and operatively connected. In addition, the encapsulation 26 holds or secures the terminal connector 24 and compressible member 28 to the electrical conductor 20 and the transparent pane 18.

One advantage of the window assembly 10 of the present invention is that the compressible member 28 eliminates the need for solder. As described above, if solder is contained within the window assembly 10 and the encapsulation 26 is applied directly on the solder, then differences in the coefficients of thermal expansion can crack the transparent pane 18 or separate the electrical conductor 20 and the terminal connector 24. However, in the window assembly 10 of the present invention, no solder is needed, because the compressible member 28 secures and electrically connects the electrical conductor 20 and the terminal connector 24. Moreover, because the compressible member 28 is compressible, stress generated by differences in the coefficients of thermal expansion is largely absorbed by the compressible member 28 and not imparted onto the electrical conductor 20. As such, replacing the solder with the compressible member 28 produces a window assembly 10 of the present invention that is more environmentally friendly as it is inherently lead-free due to the elimination of solder and less prone to failure.

The present invention has been described in an illustrative manner. It is to be understood that the terminology, which has been used, is intended to be in the nature of words of description rather than of limitation.

Many modifications and variations of the present invention are possible in light of the above teachings. Therefore, the present invention may be practiced other than as specifically described.

What is claimed is:

1. A window assembly comprising:
   a transparent pane;
   an electrical conductor contacting said transparent pane;
   an electrical connection element for energizing said electrical conductor;
   an encapsulation disposed over said electrical connection element and said electrical conductor to secure said electrical connection element to said electrical conductor and said transparent pane;
   an electrically conductive compressible member disposed between said electrical connection element and said electrical conductor and comprising a foam material that is compressed between said electrical connection element and said electrical conductor for providing an electrical connection between said electrical connection element and said electrical conductor; and
   wherein said encapsulation is disposed on said electrical connection element and an upper surface of said electrically conductive compressible member to secure said electrical connection element and said electrically conductive compressible member to said electrical conductor and said transparent pane.

2. A window assembly as set forth in claim 1 including a conductive filler in said foam material.

3. A window assembly as set forth in claim 1 including a foil layer disposed about said foam material.

4. A window assembly as set forth in claim 3 wherein said foil layer is a conductive and flexible material.

5. A window assembly as set forth in claim 1 wherein said encapsulation is made of a polymeric material.

6. A window assembly as set forth in claim 1 wherein the electrical connection between said electrical connection element and said electrical conductor is devoid of solder.

7. A window assembly comprising:
   a transparent pane;
   an electrical conductor contacting said transparent pane;
   an electrical connection element including a terminal connector for electrical connection to said electrical conductor for energizing said electrical conductor;
   a polymeric encapsulation disposed over said terminal connector and said electrical conductor to secure said terminal connector to said electrical conductor and said transparent pane;
   an electrically conductive compressible member disposed between said terminal connector and said electrical conductor and comprising a compressible foam material that is compressed between said electrical connection element and said electrical conductor for providing an electrical connection between said terminal connector and said electrical conductor without use of solder; and
   wherein said encapsulation is disposed on said terminal connector and an upper surface of said electrically conductive compressible member to secure said terminal connector and said electrically conductive compressible member to said electrical conductor and said transparent pane.

8. A window assembly as set forth in claim 7 including a conductive filler in said compressible foam material.

9. A window assembly as set forth in claim 7 including a foil layer disposed about said compressible foam material.

10. A window assembly as set forth in claim 9 wherein said foil layer is a conductive and flexible material.

11. A window assembly as set forth in claim 7 wherein said transparent pane is made of a polymethyl methacrylate, polycarbonate, or polyvinyl butyral.

12. A vehicle including said window assembly as set forth in claim 7.

13. A vehicle as set forth in claim 12 wherein said window assembly is a rear window assembly.

14. A vehicle as set forth in claim 13 wherein said rear window assembly includes a defrost system.

15. A method of making a window assembly as set forth in claim 7.

16. A solderless assembly for a transparent pane comprising:
   an electrical conductor;
   an electrical connection element for energizing said electrical conductor;
   an encapsulation disposed over said electrical connection element and said electrical conductor to secure said electrical connection element to said electrical conductor and said transparent pane;
   an electrically conductive compressible member disposed between said electrical connection element and said electrical conductor and comprising a compressible foam material that is compressed between said electrical connection element and said electrical conductor for providing an electrical connection between said electrical connection element and said electrical conductor; and
   wherein said encapsulation is disposed on said electrical connection element and an upper surface of said electrically conductive compressible member to secure said electrical connection element and said electrically conductive compressible member to said electrical conductor and said transparent pane.

* * * * *